US006961894B2

(12) United States Patent
Mottier et al.

(10) Patent No.: US 6,961,894 B2
(45) Date of Patent: Nov. 1, 2005

(54) DIGITAL TRANSMISSION METHOD OF THE ERROR-CORRECTING CODING TYPE

(75) Inventors: David Mottier, Rennes (FR); Arnaud Gueguen, Rennes (FR)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 534 days.

(21) Appl. No.: 09/775,596

(22) Filed: Feb. 5, 2001

(65) Prior Publication Data

US 2001/0016931 A1 Aug. 23, 2001

(30) Foreign Application Priority Data

Feb. 23, 2000 (FR) ........................................... 00 02579

(51) Int. Cl.[7] ........................ H03M 13/00; H03M 13/03
(52) U.S. Cl. ....................................... 714/790; 714/755
(58) Field of Search ................................ 714/755, 790, 714/791, 786

(56) References Cited

U.S. PATENT DOCUMENTS

| | | | | | |
|---|---|---|---|---|---|
| 5,983,384 | A | * | 11/1999 | Ross | 714/755 |
| 6,101,626 | A | * | 8/2000 | Morelos-Zaragoza et al. | 714/786 |
| 6,166,667 | A | * | 12/2000 | Park | 341/94 |
| 6,247,158 | B1 | * | 6/2001 | Smallcomb | 714/786 |
| 6,272,183 | B1 | * | 8/2001 | Berens et al. | 375/262 |
| 6,289,486 | B1 | * | 9/2001 | Lee et al. | 714/788 |
| 6,298,461 | B1 | * | 10/2001 | Tong et al. | 714/755 |
| 6,571,366 | B1 | * | 5/2003 | Doetsch et al. | 714/751 |

FOREIGN PATENT DOCUMENTS

| | | |
|---|---|---|
| DE | 195 21 327 | 12/1996 |
| DE | 197 36 653 | 12/1998 |

OTHER PUBLICATIONS

U.S. Appl. No. 09/775,596, filed Feb. 5, 2001.
U.S. Appl. No. 09/926,498, filed Nov. 13, 2001.
U.S. Appl. No. 09/756,778, filed Jan. 10, 2001.
U.S. Appl. No. 09/775,596, filed Feb. 5, 2001.
U.S. Appl. No. 09/777,876, filed Feb. 7, 2001.
Claude Berrou, et al., IEEE, Proceedings of the International Conference on Communications (ICC), vol. 2, pp. 1064–1070, "Near Shannon Limit Error–Correcting Coding and Decoding: Turbo–Codes (1)", May 23, 1993.

* cited by examiner

*Primary Examiner*—Guy J. Lamarre
*Assistant Examiner*—Esaw Abraham
(74) *Attorney, Agent, or Firm*—Oblon, Spivak, McClelland, Maier & Neustadt, P.C.

(57) ABSTRACT

A digital transmission method of the error-correcting coding type which includes, before a step of transmitting on a channel, a coding procedure including at least one puncturing step, and, after the transmission step, a decoding procedure including at least one depuncturing step, the coding procedure, applying a given coding scheme, generating a coded information item representing, with a certain redundancy, the useful information item and the decoding procedure estimating said useful information item by correcting transmission errors. This digital transmission method also includes a step of observing the transmission conditions and a puncturing scheme selection step for selecting, according to the at least one parameter, an optimum performance puncturing scheme amongst a plurality of predetermined puncturing schemes, the overall efficiency of the coding step and the puncturing step being a constant efficiency. The method also includes a coding scheme adaptation step which checks whether the puncturing scheme selected by the puncturing scheme selection step leads to the fill puncturing of at least one output information item of a coding step, amongst a plurality of coding steps whose association in parallel forms the coding scheme, and which, if applicable, modifies the coding scheme so that the coding step is no longer used.

20 Claims, 7 Drawing Sheets

DIGITAL TRANSMISSION METHOD OF THE ERROR-CORRECTING CODING TYPE

The present invention concerns, in general terms, a digital transmission method of the error-correcting coding type, notably for a digital transmission system on a channel with significant perturbation. More precisely, it concerns an improvement of a digital transmission method of the error-correcting coding type using convolutional code and parallel concatenation turbo-code type coding schemes, allowing an adaptation to the transmission conditions.

A digital transmission system conveys information using a physical medium such as cable, optical fibre or propagation over a radio channel, either satellite or not. Such a physical medium will be designated by the term channel. Generally, such a system comprises notably, at the sending level, a channel coding device and, at the receiving level, a decoding device.

The channel coding device has a so-called error-correcting coding function. The error-correcting coding function consists of generating, for a useful information item, a redundant information item, which, upon decoding at the destination, will enable the useful information to be reconstituted from the information arriving at the destination marred by the perturbations occurring on the channel, notably of noise, attenuation and interference type. A digital transmission method using such channel coding associated with corresponding destination decoding is referred to as an error-correcting coding type transmission method.

The quality of a digital transmission system is evaluated, in general, by calculating the error probability per transmitted bit. Said probability is notably a function of the signal to noise ratio of the link. The error-correcting coding, associated with the corresponding decoding, aims to improve the quality of the transmission by virtue of the redundancy introduced into the signal. With redundant information having been introduced by the coding device, the decoding device will use the redundant information received and its knowledge of the coding law to correct any errors. In other words, at the destination, from the received information impaired by the channel, the corresponding useful information is reconstituted. For example, on account of the redundancy, only certain coded information sequences, conforming to the coding law, are possible. If received information sequences to be decoded are different from these possible sequences, this is because they correspond to information impaired by the channel. In the case of a maximum likelihood decoding, the decoding method will reconstitute the useful information by determining, from the received information sequence and by considering the different sequences allowed, the most likely useful information sequence.

The greater the capability of discriminating between the sequences allowed by the set of coding and decoding operations, the greater the error correction capability. One important consequence of the redundancy introduced by the coding is the increase in the digital transmission output. One important parameter of the coder is therefore its efficiency which is equal to the number of information bits per bit transmitted. In general, the lower the efficiency, the more robust the code.

The performance of an error-correcting coding transmission is generally measured in terms of bit or packet error rate for a given $E_b/N_o$ ratio, where $E_b$ is the energy per information bit and $N_o$ is the power spectral density of the noise. A code is described as more or less effective according to whether its use allows a lower or less low error rate for a given $E_b/N_o$ ratio and for a given decoding complexity.

It is possible to improve the performance using a code of lower efficiency. However, that is done to the detriment of the spectral efficiency of the transmission. Generally, the efficiency used is the efficiency allowing a predetermined error rate to be guaranteed, this efficiency possibly being able to change according to the transmission conditions.

Some known error-correcting codes are the block codes. Block coding consists of associating, with each block of k information bits, a block of n bits (n>k) therefore containing (n−k) redundant bits. The block of n bits is obtained by multiplying the block of k useful bits by a matrix with k rows and n columns referred to as a generator matrix of the code. When, by permutation, the generator matrix is written in a form such that it reveals the identity matrix, so that, in the block of n bits, the k information bits and the n−k redundant bits are separate, the code is referred to as systematic. The efficiency of the code is equal to k/n. The decoding device detects the errors and corrects them by means of the minimum Hamming distance. Such error-detecting codes well known in the art are for example Hamming codes, BCH codes and Reed-Solomon codes.

The fact is also well known of performing an error-correcting coding by means of one or more convolutional coders. Their principle of operation consists of coding a block of k binary elements present at the input of the coder into a block of n binary elements, also taking into account m blocks preceding the block present at the input, by means of a device with a register. The output of the convolutional coder is composed of n coded binary elements generated by the product of convolution of the k binary elements present at the input with the response of the coder defined by n generator polynomials. The number n of generator polynomials of the coder is referred to as the dimension of the coder. The efficiency of the code is equal to k/n. The decoding device reconstructs the original data for example by means of a sequential type decoding, a decoding according to the most likely symbol, or a decoding according to the most likely sequence, as described, for example, in the document "digital Communications", by J. G. Proakis, published in 1995 by MacGraw-Hill. For example, the Viterbi algorithm provides an optimum decoding according to the most likely sequence.

According to a variant of this type of code, the coding is not performed by directly taking into account a series of m useful information items preceding the information to be coded, but by using a series of m auxiliary information items, stored in a shift register type device and each obtained by mathematical combination of a useful information item and m auxiliary information items calculated previously. Such a convolutional code is referred to as recursive. When, furthermore, the useful information emerges as it stands amongst the n outputs of the coder next to (n−1) coded information items or redundant information items, the resulting code is referred to as a recursive systematic convolutional code, or RSC code.

The fact is also known of associating different coders in order to increase the coding performance. For example, the data coded by a first coder can feed a second coder. The decoding is performed symmetrically, starting with the second code.

One effective type of coder association has been proposed, as described notably in the document "Near Shannon Limit Error-Correcting Coding and Decoding: Turbo-codes", by C. Berrou, A. Glavieux, P. Thitimajshima, published in ICC-1993, Conference Proceedings on pages 1064–1070. This type of coder association has given rise to a family of coding schemes known in the art by the name turbo-codes. Turbo-codes will designate the error-correcting codes based on the association, referred to as concatenation, of a number of simple codes, referred to as elementary codes, with the intervention of permutation operations, referred to as interleavings, which modify the order in which the data are taken into account by each of the simple codes. Elementary codes means codes introducing redundancy, of the type described above. These may be, for example, recursive systematic convolutional codes for the convolutional turbo-codes, or Hamming or BCH block codes for the block turbo-codes. Different types of concatenation can be envisaged. In parallel concatenation, the same information is coded by each coder separately after having been interleaved. In serial concatenation, the output of each coder is coded by the following coder after having been interleaved. The number of elementary coders used to implement the turbo-code is referred to as the dimension of this turbo-code. One well-known turbo-coding scheme consists of a parallel concatenation of elementary codes of the Recursive Systematic Convolutional (RSC) Code type. This turbo-code is designated by the term PCCC. Examples of serial concatenation turbo-codes are the SCCCs which use convolutional code type elementary codes and the block turbo-codes which use block code type elementary codes.

Information coded by a turbo-code can be decoded by an iterative method referred to as turbo-decoding. There are associated a number of elementary decoders with weighted inputs and outputs each corresponding to an elementary coder of the coding device. The inputs and outputs are weighted in terms of probabilities, likelihood ratios, or log likelihood ratios. Interleavers and de-interleavers allow each decoder to take into account an information item which appears in the same order as the one at the output and at the input of the corresponding coder. Each elementary decoder uses the part of the received information associated with the corresponding coder and an estimate of part or all of this information obtained by one or mote previous elementary decoders to generate an estimate of increased reliability of this same information. The additional information generated by an elementary decoder is referred to as extrinsic information. It is used by one or more following elementary decoders after adapted interleaving or de-interleaving. The exchange of extrinsic information is performed between elementary decoders within one and the same step, and from this step to the following step. Each new step therefore increases the reliability of the information generated at the output. The elementary decoders use for example the MAP, LogMAP, MaxLogMAP, SOVA or Chase algorithms, which are described, for example, in the articles "Optimal and sub-optimal maximum a posteriori algorithms suitable for turbo decoding" by P. Robertson, P. Hoeher, E. Villebrun, published in European Trans. on Telecomm., vol. 8, March-April 1997, on pages 119–125 and "A very low complexity block turbo decoder for product codes" by R. Pyndiah, P. Combelles, P. Adde, published in Proc., IEEE Globecom 1996, on pages 101–105. A thresholding is applied to the information at the output of the last decoding step in order to generate the decoded information.

The fact is also known that the efficiency of a code can be increased by a puncturing operation which consists of not transmitting certain bits of an information sequence, as described, for example, in the article "Rate-Compatible Punctured Convolutional (RCPC) codes and their application", by J. Hagenauer, published in IEEE Trans., Vol COM-36.4, 1988, on pages 389–400 or in the article "New Rate Compatible Punctured Convolutional Codes for Viterbi decoding", by L. H. C. Lee, published in IEEE Trans., Vol. COM-42.2, 1994, on pages 3073–3079. These untransmitted bits are in general redundant information bits. This puncturing operation occurs at sending level, after the coding operation. At destination level, a reciprocal depuncturing operation is performed before the decoding operation. The puncturing and depuncturing operations are defined by one and the same puncturing scheme or matrix. The puncturing of redundant information bits decreases the correction capability of the code and increases its efficiency.

The error-correcting codes according to the prior art described above, and notably the error-correcting codes of the turbo-code family, make it possible to obtain a very effective error correction while retaining sufficiently high efficiencies and allowing decoding operations of low complexity compared with the complexity of the code.

However, it is known that the performance of a transmission using an error-correcting code varies according to the transmission conditions. Transmission conditions means the parameters influencing the performance of the transmission such as notably the signal to noise ratio, but also the bit or packet error rate, the signal to interference plus noise ratio, the number of active users of a telecommunications system, the quality of service required by the transmission system, the speed of movement of the user of the transmission system or any other parameter.

In the prior art, adaptation to the transmission conditions is performed by decreasing or increasing the efficiency in order to make the code more or less robust according to whether the channel is more or less severe. In order not to have to modify the structure of the coder, puncturing is carried out. To each efficiency there corresponds a unique puncturing scheme.

However, the different codes have non-uniform performances, when they are compared at equal efficiency, depending on the transmission conditions. Thus, for example, a two-dimensional PCCC has an excellent performance at a low signal to noise ratio, the error rate then capable of being less, at identical efficiency, than that generated by the use of a turbo-coder of greater dimension. More generally, it has been revealed that, when a convolutional turbo-code is used, the curves of bit error rate as a function of the signal to noise ratio, although they decrease very rapidly beyond a characteristic point which will be designated by the term avalanche point, remain, before this point, in areas of performance lower than those corresponding to equivalent convolutional codes, that is to say ones of the same efficiency.

Within the context of the present invention, the performances of different convolutional codes and turbo-codes at constant efficiency have been systematically compared. FIG. 8 presents an example from this study in the form of performance curves giving the bit error rate as a function of the signal to noise ratio. The performance curve 20 is characteristic of the use of a convolutional code, while the performance curves 21 and 22 are characteristic of the use of convolutional turbo-codes of respective dimensions 2 and 3 which use, as elementary codes, the same convolutional code as that of the curve 20. Different puncturing schemes have been applied for these three codes so that their efficiencies are equal. It has thus been revealed that, at a given coding efficiency, the greater the dimension of the turbo-codes, the higher the signal to noise ratio which must be achieved to reach the avalanche effect which follows the avalanche point. Before this, their performances are lower than those of a turbo-code of lower dimension, beyond, they become rapidly higher. Thus, in FIG. 8, the avalanche point 23 belonging to the 3-dimensional turbo-code corresponds to a signal to noise ratio above that of the avalanche point 24 belonging to the 2-dimensional turbo-code. Before an intersection point 26 situated slightly after the avalanche point 23, the 3-dimensional turbo-code is less effective than the 2-dimensional turbo-code. Beyond, it is more effective. Before an intersection point 25, the convolutional code is more effective than the 2-dimensional turbo-code. Beyond, it is less effective.

More generally still, the fact has been revealed that, for all n-dimensional codes, such as convolutional codes, where the dimension n is equal to the number of generator polynomials, and turbo-codes, where the dimension n is equal to the number of elementary coders, whose efficiency without puncturing is $R_m$, there exists, for a given efficiency $R_c>R_m$, an optimum distribution of the redundancy for given transmission conditions.

An object of the present invention is therefore to adapt a transmission method of the error-correcting coding type according to the transmission conditions by modifying the distribution of the redundant information at constant efficiency.

To that end, it proposes a digital transmission method of the error-correcting coding type, comprising, before a step of transmitting on a channel, a coding procedure, applying a given coding scheme in order to generate, from a useful information item, a coded information item with a certain redundancy, and comprising at least one puncturing step applying a given puncturing scheme, and, after said step of transmitting on said channel, a decoding procedure, applying a given decoding scheme, in order to obtain, from an information item to be decoded, an estimate of said useful information item, correcting transmission errors by means of said certain redundancy, and comprising at least one depuncturing step applying a given depuncturing scheme, said transmission method being characterised in that it also comprises a step of analyzing the transmission conditions in order to determine at least one parameter characteristic of the transmission conditions, a puncturing scheme selection step for selecting, according to said at least one parameter, an optimum performance puncturing scheme amongst a plurality of predetermined puncturing schemes, a depuncturing scheme selection step for selecting, according to said at least one parameter, a depuncturing scheme corresponding to said optimum performance puncturing scheme amongst a plurality of predetermined depuncturing schemes, the overall efficiency of said coding procedure associated with said at least one puncturing step being a constant efficiency.

Thus, fixing a target efficiency $R_c$ higher than the efficiency of the initial coding scheme $R_m$, the distribution of the puncturing is adjusted dynamically over time according to the transmission conditions in order to guarantee the best performance. As said previously, the parameter or parameters characteristic of the transmission conditions can be the bit error rate, the packet error rate, the signal to noise ratio, the signal to interference plus noise ratio, the number of active users of a telecommunication system, the quality of service required by the transmission system, the speed of movement of the user of the transmission system or any other parameter capable of influencing the performance of the transmission system. This parameter or these parameters can be directly evaluated at sending level, for example, from measurements made on the signals transmitted. They can also be supplied by an external control signal. The plurality of puncturing schemes is predetermined according to a prior study of the coding performance as a function of the transmission conditions making it possible to determine, for each transmission condition, the puncturing scheme leading to the best performance. Notably, two puncturing schemes can be distinguished by the fact that the elementary coded information of one or more elementary coding steps is fully punctured by applying one whereas it is not by applying the other. In this way, if, for example, the turbo-codes case is taken, the change of puncturing scheme may be equivalent to a change of dimension of the turbo-code. For example, if reference is made to the performance curves of FIG. 8, there can be predefined, on the basis of a 3-dimensional turbo-code, three puncturing schemes, whose respective combinations with the coding scheme make it possible to obtain three turbo-coding equivalences of dimensions respectively 1, 2 and 3 having the same efficiency. The 1-dimensional turbo-code corresponds to a convolutional code. In operation, the puncturing scheme is selected so that the equivalent operation of the coding operation and the puncturing operation is a convolutional coding when the signal to noise ratio is below the point of intersection 25 between the curve 20 and the curve 21, the puncturing scheme is selected so that this equivalent operation is a 2-dimensional turbo-coding when this signal to noise ratio is between this point of intersection 25 and the point of intersection 26 between the curve 21 and the curve 22, and the remainder of the time the puncturing scheme is selected leading to no full puncturing. This thus gives a coding at constant efficiency with an optimum performance curve depicted in broken lines in FIG. 9. The puncturing schemes corresponding to the different transmission conditions can be stored in a look-up table.

According to another aspect of the present invention, said coding procedure comprising a plurality of elementary coding steps associated in parallel, each of said elementary coding steps generating an elementary coded information item, also comprises a coding scheme adaptation step which checks whether said puncturing scheme selected by said puncturing scheme selection step leads to the fill puncturing of the elementary coded information of one of said elementary coding steps and which, if applicable, modifies said coding scheme so as to no longer have to use said at least one of said elementary coding steps.

According to another aspect of the present invention, said coding procedure applies a coding scheme of the convolutional coding type, said elementary coding steps being associated in parallel and each generating an elementary coded information item issuing from the product of convolution of a sequence constituted by said useful information item and by a certain number of auxiliary information items, possibly corresponding to previous useful information items, with a response defined by a generator polynomial.

According to another aspect of the present invention, said coding procedure applies a coding scheme of the turbo-coding type, said elementary coding steps being concatenated in parallel, in association with adapted interleaving steps and a puncturing step occurring after a multiplexing step combining the elementary coded information items of said elementary coding steps.

According to another aspect of the present invention, said decoding procedure comprising a plurality of elementary decoding steps corresponding respectively to said elementary coding steps, each of said elementary decoding steps processing an information item to be decoded corresponding to said elementary coded information item of the corresponding elementary coding step, also comprises a decoding scheme adaptation step which checks whether said depuncturing scheme selected by said depuncturing scheme selection step indicates that at least one of said elementary decoding steps corresponds to an elementary coding step whose elementary coded information is fully punctured and which, if applicable, modifies said decoding scheme so as to no longer have to use said at least one of said elementary decoding steps.

This decoding scheme adaptation step thus defined can be suitable for a parallel turbo-code.

According to another aspect of the present invention, said decoding procedure reconstituting the useful information from n information items to be decoded corresponding to n coded information items representing the useful information issuing from said elementary coding steps, also comprises a decoding scheme adaptation step which checks whether said depuncturing scheme selected by said depuncturing scheme selection step indicates that at least one of said coded information items was fully punctured and which, if applicable, modifies said decoding scheme so as to no longer take into account the information to be decoded corresponding to said at least one of said coded information items.

This decoding scheme adaptation step thus defined is particularly adapted for convolutional codes.

The characteristics of the invention mentioned above, as well as others, will emerge more clearly from a reading of the following description of an example embodiment, said description being given in relation to the accompanying drawings, amongst which:

In the main, in a digital transmission method of the error-correcting coding type, the present invention makes it possible, by keeping constant the overall efficiency, that is to say the efficiency taking into account the puncturing operation, equal to a predetermined target efficiency $R_c$ higher than the coding efficiency $R_m$, to select, according to the transmission conditions, a puncturing scheme amongst predetermined puncturing schemes, so that the performance of the digital transmission method with error-correcting coding is optimum for these transmission conditions.

The embodiments of the present invention described apply to a transmission method of the error-correcting coding type in which, at sending level, a coding procedure comprises n elementary coding steps each generating an elementary coded information item. This can be notably a parallel concatenation turbo-coding method. It can also be a convolutional code, the n elementary coding steps then being defined by the n generator polynomials of the convolutional code. At destination level, a decoding procedure reconstitutes the information by means of n elementary decoding steps corresponding to the n elementary coding steps or n information items to be decoded corresponding to the information items coded by the n elementary coding steps in the convolutional code case. More precisely, in the latter case, the n information items to be decoded correspond to the n punctured coded information items, transmitted on the channel and depunctured.

Figure 1:
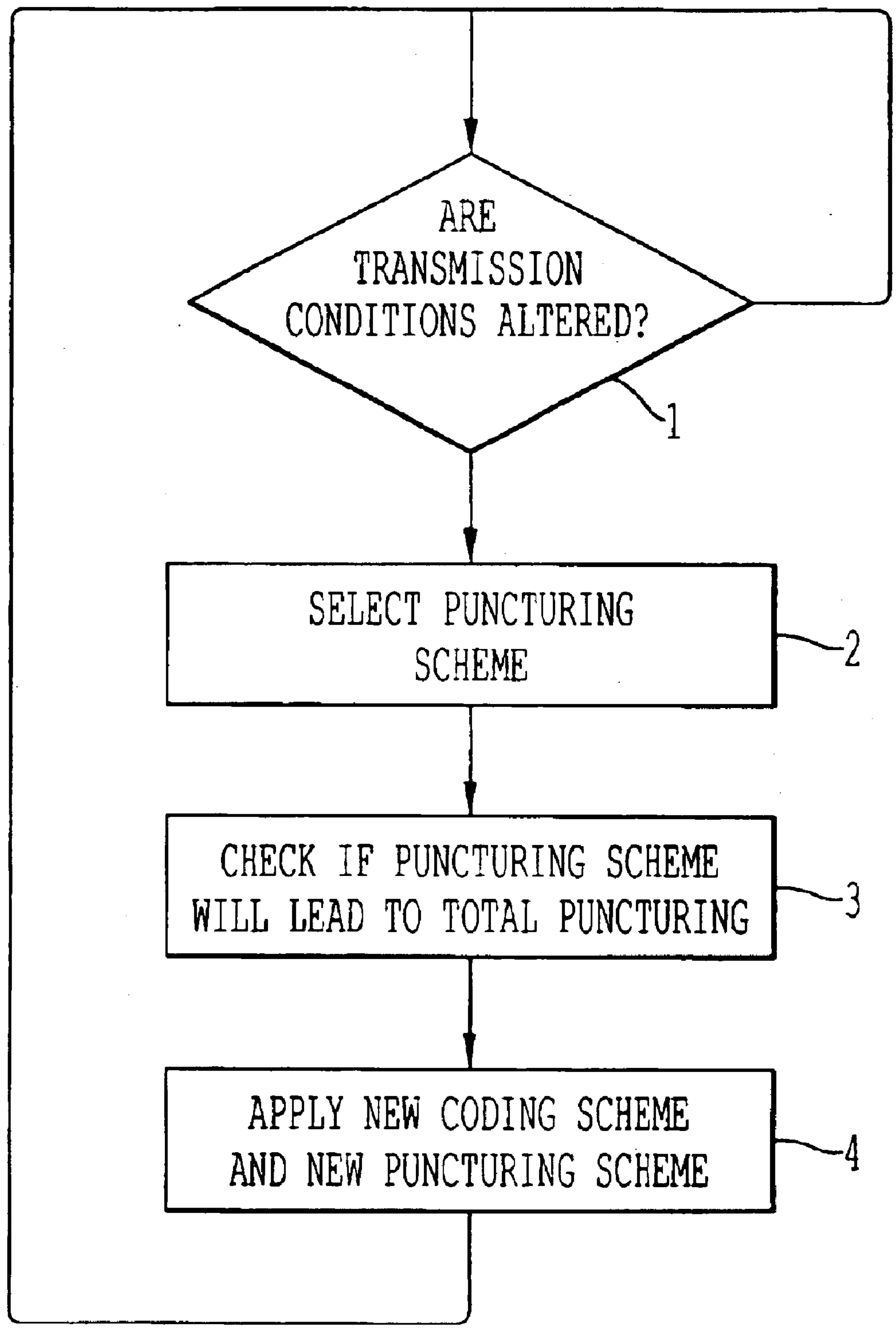
FIG. 1 is a flow diagram illustrating the basic principle of a puncturing scheme selection step of a transmission method according to the present invention.

FIG. 1 presents a puncturing and coding scheme selection processing according to the present invention. A decision block 1 determines whether or not the transmission conditions are altered. For this, it is based on a parallel processing (not depicted) for observing the transmission conditions which continuously analyzes the transmission conditions. This processing is based, for example, on a parameter such as the signal to noise ratio which it measures continuously. When this parameter changes from one state to another, the decision block 1 moves the processing to a step 2. In the step 2, a puncturing scheme is selected according to the parameter or parameters measured by the transmission conditions observation processing. The selection is performed amongst a plurality of predetermined puncturing schemes for the target efficiency $R_c$. These schemes are, for example, stored in a look-up table. Each of these puncturing schemes corresponds, for a given transmission condition, to an optimum puncturing scheme, that is to say the one whose association with the coding scheme leads to the best transmission performance. This performance is measured, for example, in terms of bit error rate. In this way, for each given transmission condition, the step 2 selects the optimum puncturing scheme, with no alteration of the target efficiency $R_c$.

A step 3, prior to application of the puncturing scheme determined by the step 2, will check whether the application of this puncturing scheme leads to the total puncturing of elementary coded information of one or more elementary coding steps and modify the coding scheme in consequence.

A step 4, finally, will apply the new coding scheme and the new puncturing scheme determined by the previous steps.

The processing then returns to the decision block 1 and remains there as long as there is no new alteration of the transmission conditions.

Figure 2:
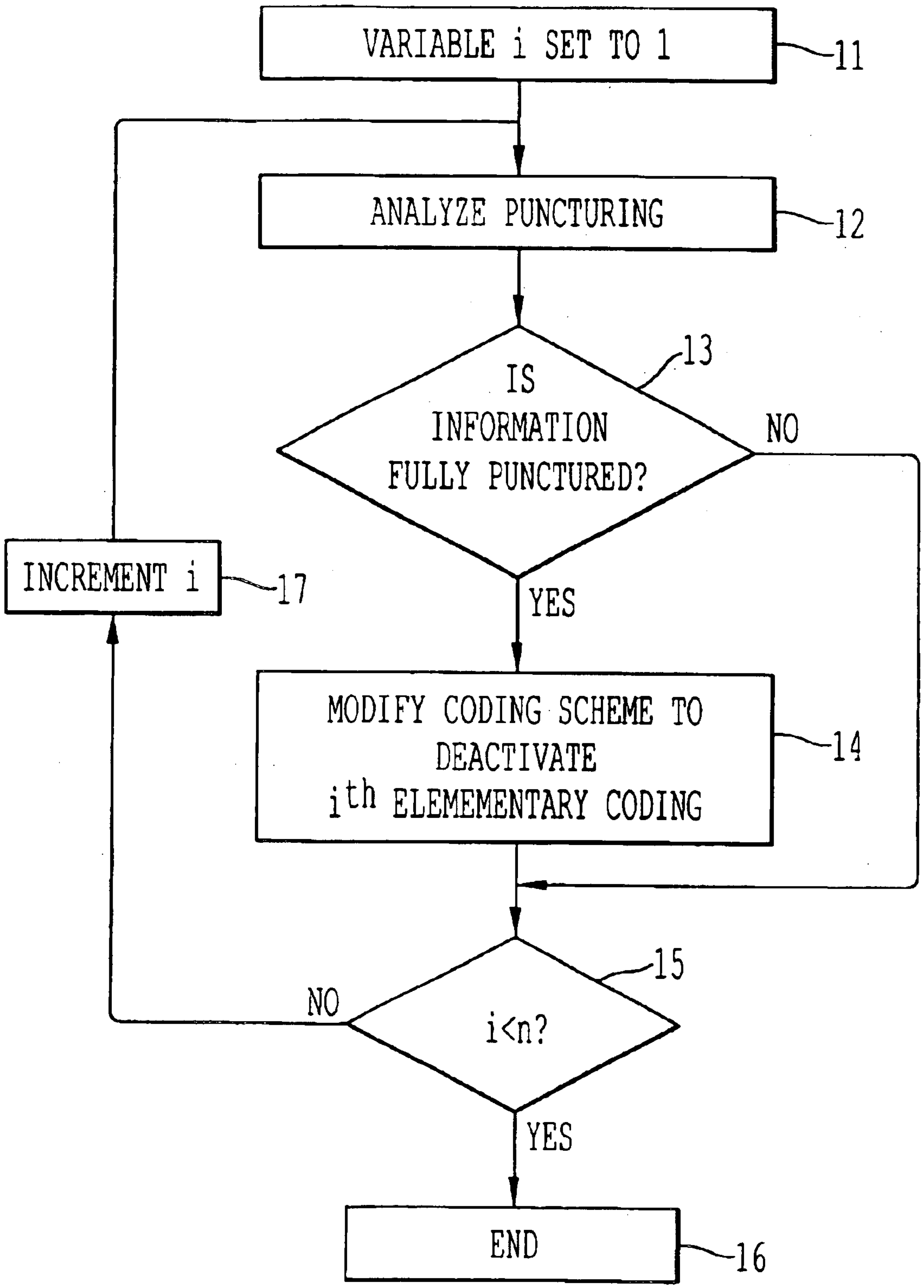
FIG. 2 is a flow diagram illustrating the basic principle of a coding scheme adaptation step of a transmission method according to the present invention.

FIG. 2 describes more precisely the processing performed at the step 3.

At a step 11, a variable i is initialized to 1. This variable i is incremented at a step 17 so as to make it possible to analyze the effect of the puncturing on each of the elementary coded information items of the n coding steps. At a step 12, the processing analyzes the puncturing applied to the coded information generated by the $i^{th}$ elementary coding step according to the puncturing scheme selected at the step 2. If the puncturing applied to the elementary coded information generated by the $i^{th}$ elementary coding step is fill, the decision block 13 moves the processing to the step 14. Otherwise, the processing goes directly to the step 15. At the step 14, the coding scheme is modified in order that the $i^{th}$ elementary coding step is deactivated. At the decision block 15, it is determined whether or not i is less than n. If it is, the processing returns to the step 12, passing through the step 17 where i is incremented. Otherwise, the processing goes to the step 16 which concludes the step 3.

The processing implemented at sending level requires, at destination level, a specific depuncturing and decoding operation established on the bases of the decoding operation corresponding to the coding used and taking into account the different puncturing schemes selected at sending level. For example, there can be reconstituted, before decoding, the coded sequence of efficiency equal to the coding efficiency by inserting a bit of null reliability, that is to say a value carrying no information on the corresponding bit, at the location where a bit was punctured. Simplifications are possible at decoding level if elementary coded information items of one or more elementary coding steps were fully punctured at sending.

Figure 3:
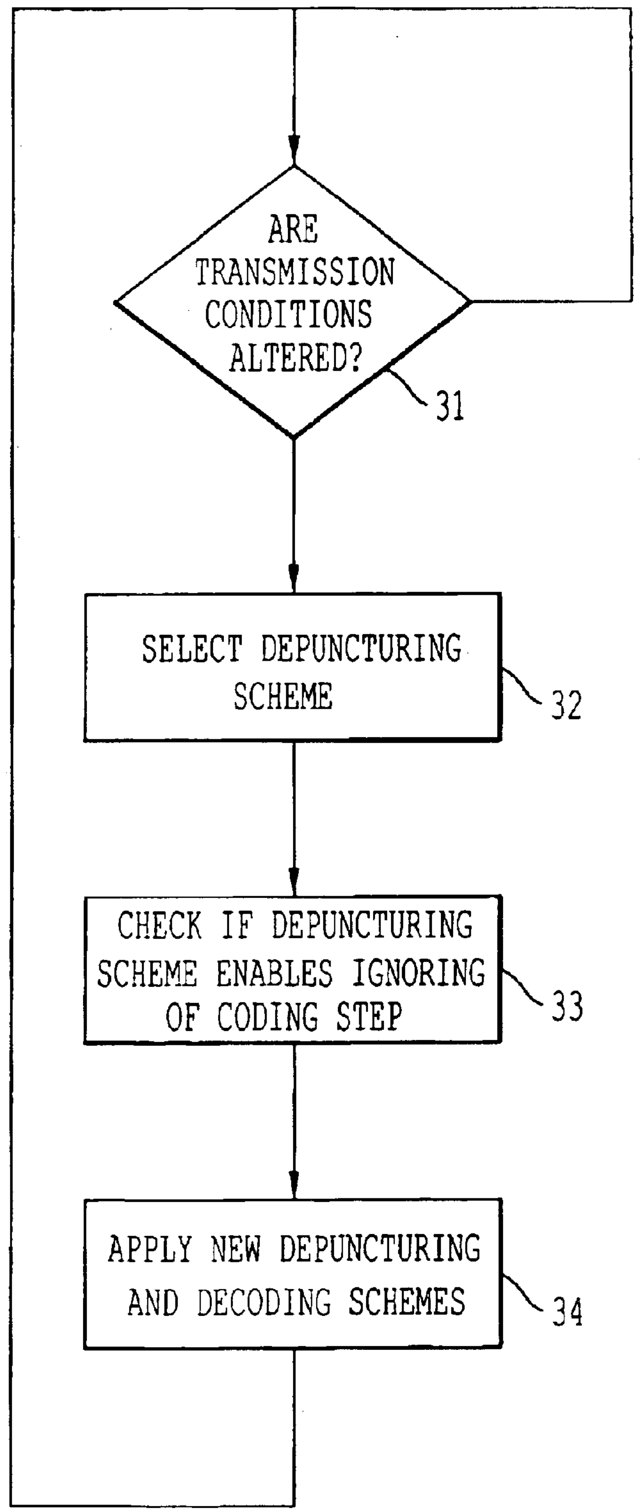
FIG. 3 is a flow diagram illustrating the basic principle of a depuncturing scheme selection step of a transmission method according to the present invention.

FIG. 3 presents a depuncturing scheme and decoding scheme selection processing according to the present invention. A decision block 31 determines whether or not the transmission conditions are altered. For this, it is based on a parallel processing (not depicted) for observing the transmission conditions which continuously analyzes the transmission conditions. This processing is based, for example, on a parameter such as the signal to noise ratio which it measures continuously. When this parameter changes from one state to another, the decision block 31 moves the processing to a step 32. In the step 32, a depuncturing scheme is selected according to the parameter or parameters measured by the transmission conditions observation processing. The selection is performed amongst a plurality of predetermined depuncturing schemes for the target efficiency $R_c$, and corresponding to the puncturing schemes mentioned in the description of FIG. 1. These schemes are, for example, stored in a look-up table. A step 33, prior to application of the depuncturing scheme determined by the step 32, will check whether the application of this depuncturing scheme makes it possible to ignore one or more of the elementary decoding steps and modify the decoding scheme and the depuncturing scheme in consequence.

A step 34, finally, will apply the new depuncturing and decoding schemes such as emerge from the previous steps.

The processing then returns to the decision block 31 and remains there as long as there is no new alteration of the transmission conditions.

Figure 4:
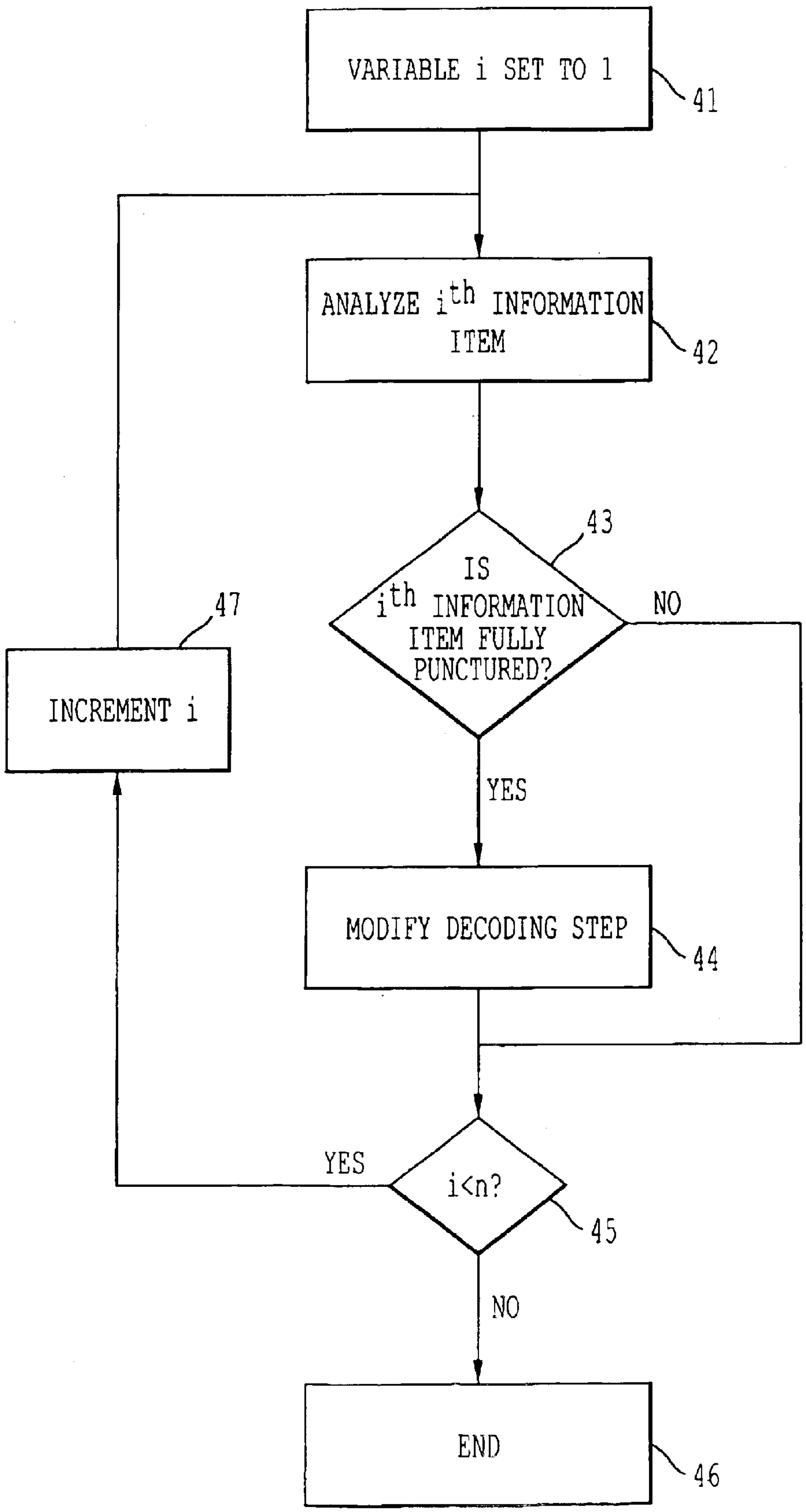
FIG. 4 is a flow diagram illustrating the basic principle of a decoding scheme adaptation step of a transmission method according to the present invention.

FIG. 4 describes more precisely the processing performed at the step 33.

At a step 41, a variable i is initialized to 1. This variable i is incremented at a step 47 so as to make it possible to analyze, one after another, each of the n elementary decoding steps of the decoding procedure, or the n information items to be decoded in the convolutional code case. The processing, at the step 42, analyzes the information to be decoded by the $i^{th}$ elementary decoding step, or the $i^{th}$ information item to be decoded, as emerges from the depuncturing according to the depuncturing scheme selected at the step 32. If the $i^{th}$ elementary decoding step, or the $i^{th}$ information item to be decoded, corresponds to an elementary coding step whose coded information item is fully punctured, or to a fully punctured coded information item, the decision block 43 moves the processing to the step 44. Otherwise, the processing goes directly to the step 45. At the step 44, the decoding scheme is modified in order that the decoding procedure no longer uses the $i^{th}$ elementary decoding step, or the $i^{th}$ information item to be decoded, and the depuncturing scheme is modified so that the corresponding depuncturing is no longer performed. At the decision block 45, it is determined whether or not i is less than n. If it is, the processing returns to the step 42, passing through the step 47 where i is incremented. Otherwise, the processing goes to the step 46 which concludes the step 33.

According to one embodiment of the present invention, the transmission method of the error-correcting coding type can use a convolutional coding.

Figure 5:
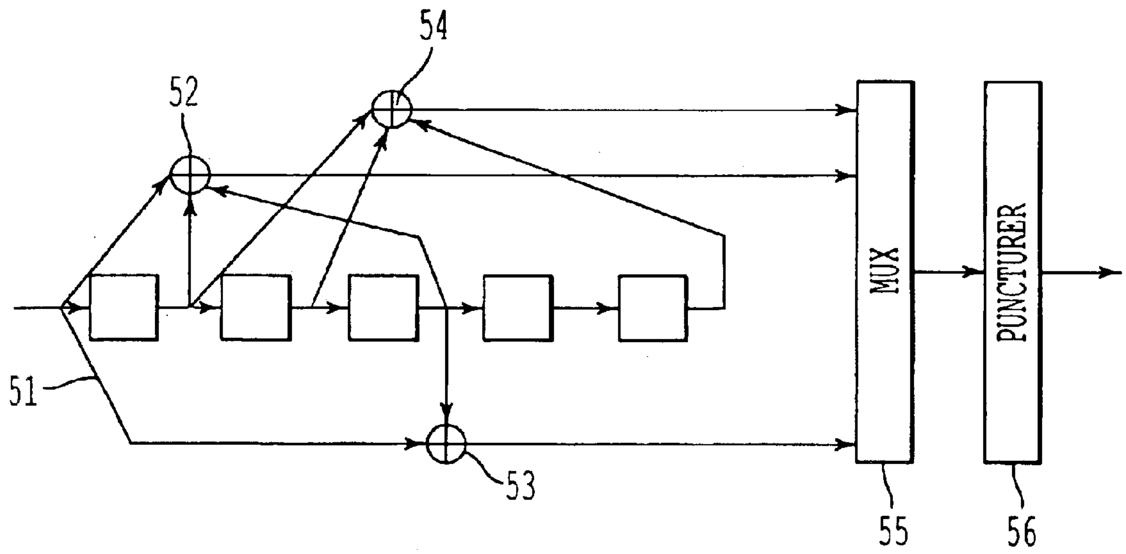
FIG. 5 is a diagram illustrating a three-dimensional convolutional coder.

FIG. 5 presents a three-dimensional convolutional coder. The input blocks contain one bit (k=1). The output blocks contain three bits (n=3). The memory effect is of length 5 (m=5). Its efficiency is ⅓. The three output information items, corresponding to three generator polynomials, are produced by combinational logic, the element 54 defining the first generator polynomial, the element 52 defining the second generator polynomial and the element 53 defining the third generator polynomial. After going into a multiplexer 55, the output information goes into a puncturer 56. The puncturer 56 is controlled by virtue of puncturing scheme selection processing such as that described with reference to FIG. 1, with n=3. The puncturing scheme can therefore be modified during transmission if the transmission conditions are altered. The implementation of the coding can be simplified if the puncturing scheme chosen leads to the full puncturing of at least one output of the elements 52, 53 and 54. In this case, the combinational logic associated with this output is deactivated. At destination level, the decoding processing is associated with a depuncturing processing which can also be modified during transmission in order to take into account alterations in the transmission conditions. For example, in the Viterbi algorithm, there is reconstituted, before decoding, the coded sequence of efficiency equal to the coding efficiency by inserting a bit of null reliability at the location where a bit was punctured. The implementation of the decoding is simplified if one or more of the n output information items of the coder are never used. It is then not necessary to reconstitute, before decoding, the binary sequence associated with that one or those of the n information items which are not transmitted. In other words, the decoding can be implemented by reconstituting only those amongst the n information items to be decoded which correspond to partly punctured or non-punctured information items.

According to one embodiment of the present invention, the transmission method of the error-correcting coding type can use a parallel concatenation turbo-coding.

Figure 6:
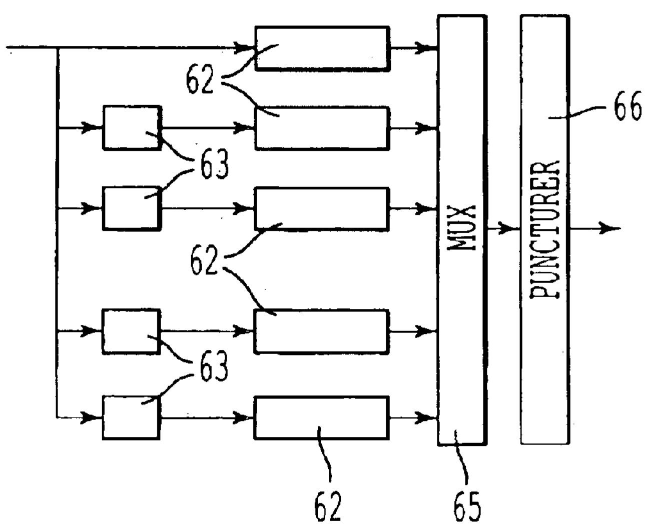
FIG. 6 is a diagram illustrating an n-dimensional parallel turbo-coder.
Figure 7:
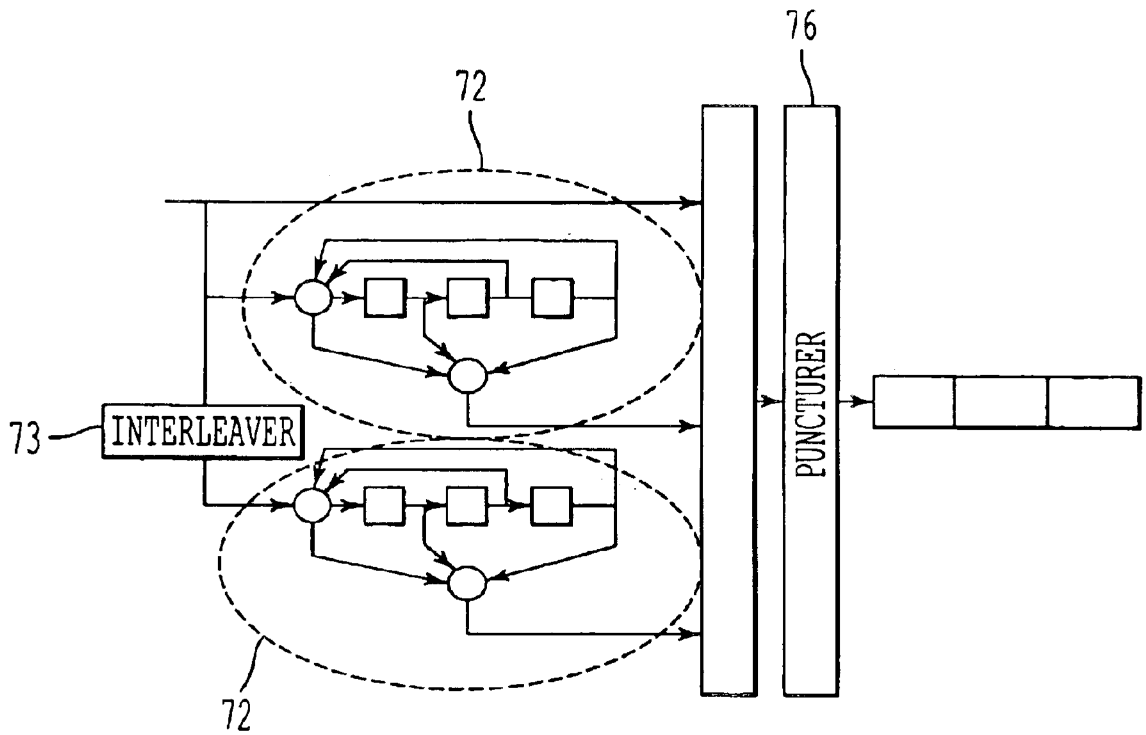
FIG. 7 is a diagram illustrating a two-dimensional PCCC.

FIG. 6 presents an n-dimensional parallel concatenation turbo-coder 61. It comprises n elementary coders 62. These coders 62 can apply either one and the same elementary code, or different codes. Each elementary coder 62 codes an input information item previously processed by a corresponding interleaver 63 which is specific to said coder, so that none of said elementary coders 62 takes account of the information in the same way. The input bits are coded in blocks of N, N being the size of the interleavers. The output of each of the elementary coders goes into a multiplexer 65 and then into a puncturer 66. FIG. 7 presents an example of a two-dimensional PCCC. The efficiency of the elementary coders 72 is ½. However, the systematic part is transmitted only once. In this way, the efficiency of the turbo-code is ⅓.

The puncturer 66 or 76 is controlled by virtue of a puncturing scheme selection processing such as that described with reference to FIG. 1, with n=2 in the PCCC case. The puncturing scheme can therefore be modified during transmission if the transmission conditions vary. If the required puncturing consists of no longer transmitting the output of one of the elementary coders, it is no longer necessary to perform the coding and interleaving operations associated with this dimension.

Figure 8:
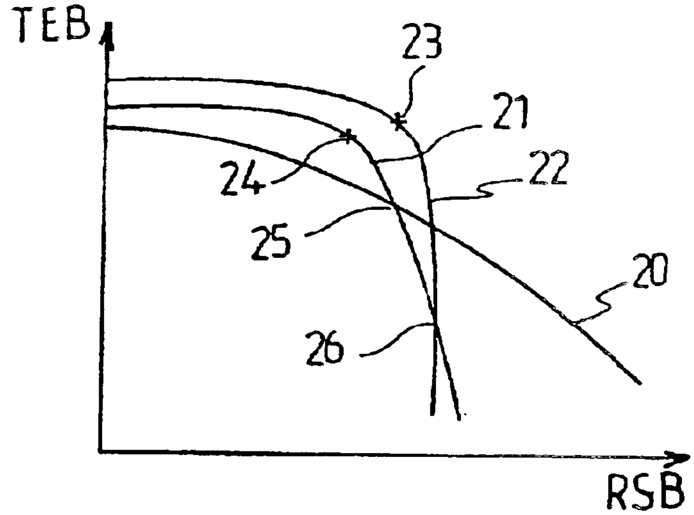
FIG. 8 is a graph showing performance curves of turbo-codes with different dimensions.
Figure 9:
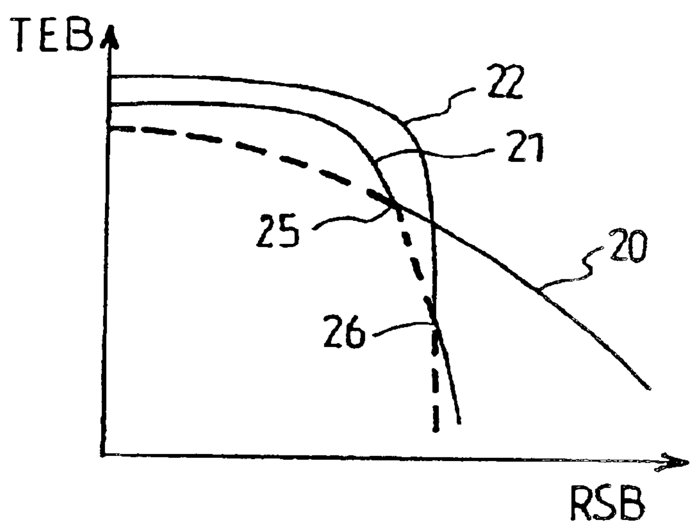
FIG. 9 is a graph showing an optimum performance curve of a three-dimensional turbo-code to which there is applied a dynamic puncturing according to the present invention.

For example, with reference to the performance curves of FIG. 8, the puncturer 76 acting downstream of the PCCC of FIG. 7 can be controlled according to two puncturing schemes alternating during transmission according to the variations in transmission conditions. Each of these schemes is chosen so as to conform to the optimum performance curve depicted in FIG. 9. In other words, a first of these puncturing schemes must be such that the puncturing corresponding to the output of the second elementary coder 72 is a total puncturing. The overall efficiency can then be equal to the efficiency of an elementary coder, that is to say an efficiency of ½. The other of these puncturing schemes must be such that the outputs of the two elementary coders are not fully punctured. However, in order to work at constant efficiency, it is necessary for these outputs to be punctured so that the overall efficiency is ½. This second puncturing scheme will therefore operate so that half the redundant bits issuing from each elementary coder are punctured. If reference is made to the performance curves of FIG. 8, the first puncturing scheme will be applied when the signal to noise ratio is below the point of intersection 25 between the curve 20 and the curve 21, and the second puncturing scheme will be applied when the signal to noise ratio is above this intersection point. When the first puncturing scheme is applied, the second elementary coder 72 and the interleaver 73 are deactivated, which simplifies the coding operations carried out. Of course, another target efficiency $R_c$ higher than the efficiency $R_m$=⅓ of the PCCC can be used for working. For this, it is simply necessary to adapt the puncturing schemes.

The depuncturing processing, at destination level, performs the operation which is the reverse of the puncturing. Values which carry no information are inserted in the place of punctured bits. If the output of an elementary coder was fully punctured at source level, it is not depunctured on reception and the elementary decoder corresponding to this elementary coder does not act in the turbo-decoder.

What is claimed is:

1. A digital transmission method for error-correcting coding, comprising:

coding, including applying a given coding scheme to generate a coded information item having a certain redundancy from a selected information item;

transmitting the coded information item on a channel;

obtaining at least one parameter used in the transmitting;

puncturing the coded information item based on the at least one parameter;

decoding the coded information item after the transmitting to obtain an estimate of the selected information item;

correcting at least one transmission error based on the certain redundancy; and depuncturing the coded information item based on the at least one parameter.

2. The digital transmission method according to claim 1, wherein the at least one parameter includes at least one of a bit error rate, a packet error rate, a signal to noise ratio, a signal to interference plus noise ratio, a number of users of a telecommunication system, a quality of service required by the transmission system, or a speed of movement of a user of the transmission system.

3. The digital transmission method according to claim 2, wherein the coding comprises:

a plurality of elementary coding steps associated in parallel, each of the elementary coding steps generating an elementary coded information item; and an adapting step for checking if the puncturing obtains a full puncturing of the elementary coded information item and for modifying the coding based on the checking.

4. The digital transmission method according to claim 3, wherein the elementary coding includes convolutional coding applied to the selected information item, thereby generating each elementary coded information item.

5. The digital transmission method according to claim 4, wherein the convolutional coding is applied to the selected information item and at least one auxiliary information item, thereby generating a generator polynomial.

6. The digital transmission method according to claim 5, wherein the at least one auxiliary information item includes at least one of a bit error rate, a packet error rate, a signal to noise ratio, a signal to interference plus noise ratio, a number of users of a telecommunication system, a quality of service required by the telecommunication system, or a speed of movement of a user of the telecommunication system.

7. The digital transmission method according to claim 3, wherein the coding includes turbo-coding, the plurality of elementary coding steps are concatenated in parallel and have interleaving adapting steps, and the puncturing occurs after a multiplexing step commingling a plurality of elementary coded information items generated by the plurality of elementary coding steps.

8. The digital transmission method according to claim 7 wherein the coding includes parallel concatenation turbo-coding.

9. The digital transmission method according to claim 7, wherein the coding includes parallel concatenation block turbo-coding.

10. The digital transmission method according to claim 3, wherein the decoding includes:

a plurality of elementary decoding steps, respectively corresponding to said plurality of elementary coding steps, and processing each elementary coded information item; and decoding adapting to remove any of the plurality of elementary decoding steps having a fully punctured elementary coded information item.

11. The digital transmission method according to claim 3, wherein the decoding includes adapting to remove any fully punctured coded information item.

12. The digital transmission method according to claim 1, wherein the coding comprises:

a plurality of elementary coding steps associated in parallel, each of the elementary coding steps generating an elementary coded information item; and an adapting step for checking if the puncturing obtains a full puncturing of the elementary coded information item and for modifying the coding based on the checking.

13. The digital transmission method according to claim 12, wherein the elementary coding includes convolutional coding applied to the selected information item, thereby generating each elementary coded information item.

14. The digital transmission method according to claim 13, wherein the convolutional coding is applied to the selected information item and at least one auxiliary information item, thereby generating a generator polynomial.

15. The digital transmission method according to claim 14, wherein the at least one auxiliary information item includes at least one of a bit error rate, a packet error rate, a signal to noise ratio, a signal to interference plus noise ratio, a number of users of a telecommunication system, a quality of service required by the telecommunication system, or a speed of movement of a user of the telecommunication system.

16. The digital transmission method according to claim 12, wherein the coding includes turbo-coding, the plurality of elementary coding steps are concatenated in parallel and have interleaving adapting steps, and the puncturing occurs after a multiplexing step commingling a plurality of elementary coded information items generated by the plurality of elementary coding steps.

17. The digital transmission method according to claim 16, wherein the coding includes parallel concatenation turbo-coding.

18. The digital transmission method according to claim 16, wherein the coding includes parallel concatenation block turbo-coding.

19. The digital transmission method according to claim 12, wherein the decoding includes:

a plurality of elementary decoding steps, respectively corresponding to said plurality of elementary coding steps, and processing each elementary coded information item; and decoding adapting to remove any of the plurality of elementary decoding steps having a fully punctured elementary coded information item.

20. The digital transmission method according to claim 12, wherein the decoding includes adapting to remove any fully punctured coded information item.

* * * * *